United States Patent [19]

Pichl

[11] Patent Number: 5,170,544
[45] Date of Patent: Dec. 15, 1992

[54] METHOD OF PRODUCING ELECTRICAL RESONANT CIRCUITS, SPECIFICALLY RESONANCE LABELS

[75] Inventor: Fritz Pichl, Kilchberg, Switzerland

[73] Assignee: Kobe Properties Ltd., Isle of Man, Isle of Man

[21] Appl. No.: 688,273

[22] Filed: Apr. 22, 1991

[30] Foreign Application Priority Data

Aug. 17, 1990 [CH] Switzerland ............... 2684/90

[51] Int. Cl.⁵ .................................. H01G 4/40
[52] U.S. Cl. ........................... 29/25.42; 29/602.1; 361/402; 427/81
[58] Field of Search ............... 29/25.42, 602.1; 361/402, 304, 323; 427/79, 81

[56] References Cited

U.S. PATENT DOCUMENTS 4,369,557  1/1983  Vandebult .................. 29/25.42

Primary Examiner—Carl E. Hall
Attorney, Agent, or Firm—Laurence R. Brown

[57] ABSTRACT

In order to produce resonance labels a coil having the shape of a spiral and a first capacitor surface located adjacent the innermost winding of the spiral and, furthermore, a supplementary surface adjacent the outer end of the spiral are produced at one side only of a supporting foil by an etching method from an aluminum foil arranged on the supporting foil. An aluminum foil strip is sealed onto the other side of the supporting foil at a superimposed position relative to the first capacitor surface, a few windings of the spiral and the supplementary surface to form the second capacitor surface. After establishing an electrical connection between this strip and the supplementary surface at the other side an electrical resonant circuit is produced. Due to the sealed on aluminum foil strip the etching procedure is reduced to only one side with the advantage that considerably less poisonous etching sludge is thus produced.

6 Claims, 1 Drawing Sheet

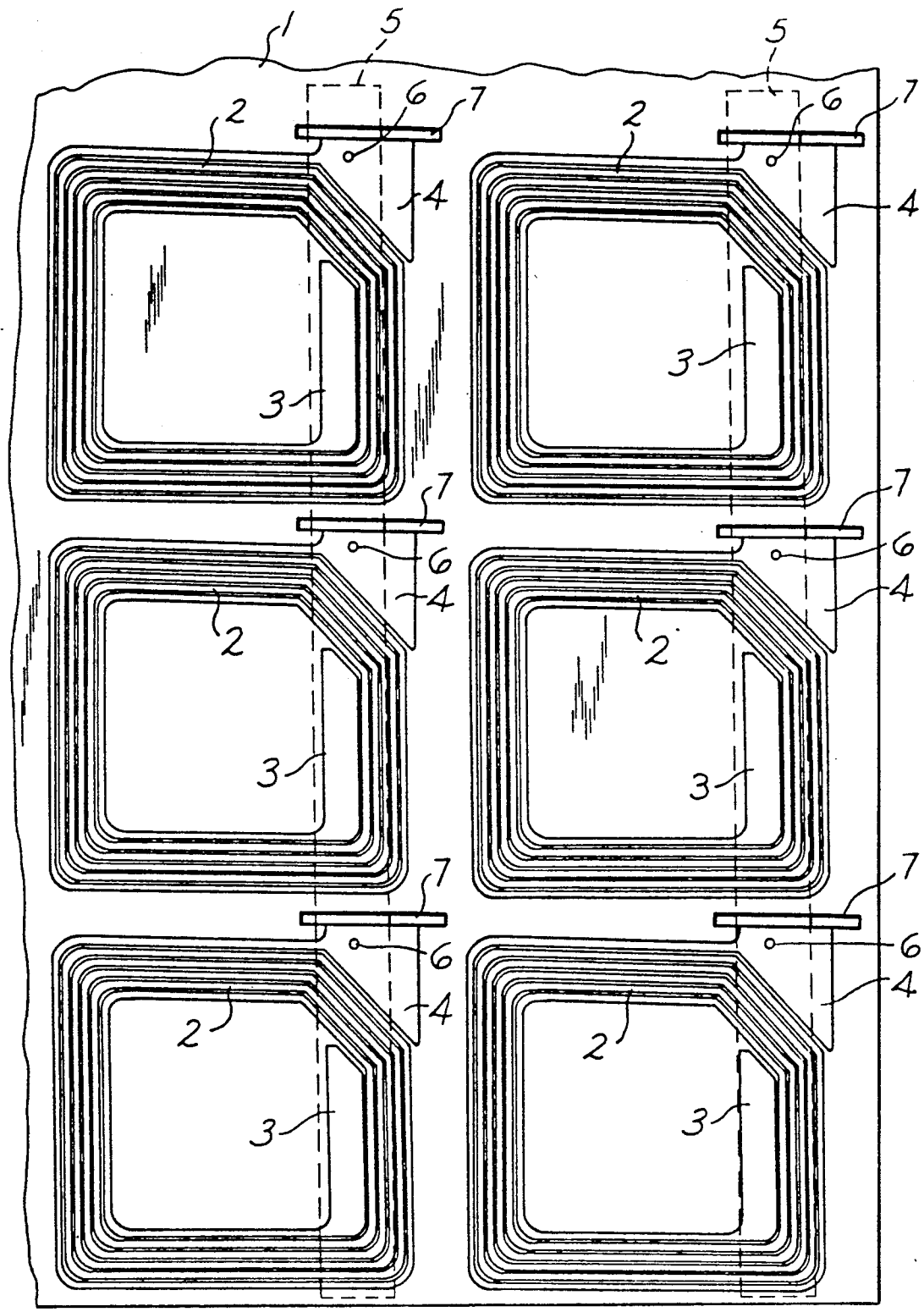

METHOD OF PRODUCING ELECTRICAL RESONANT CIRCUITS, SPECIFICALLY RESONANCE LABELS

BACKGROUND OF THE INVENTION

1. Field of the Invention

The present invention relates to a method of producing electrical resonant circuits, specifically of resonance labels for use in a theft protection system in which a coil and a capacitor located on a dielectric form a respective resonant circuit, where the coil having the shape of a spiral and forming one surface of the capacitor is located in the one side and the second surface of the capacitor is located at the other side of the dielectric.

2. Description of the Prior Art

Electrical resonant circuits of this kind placed onto a supporting foil and thereafter treated further in order to be used as adhesive labels or hard shells of a plastic material in a theft protection system have until now been produced predominantly by means of an etching, method in which the base material consists of two aluminum foils separated from each other by a non-conductive layer such as a plastic material, and in which by means of a printing of an etching medium resistant lacquer onto the two aluminum foils the desired shape of the resonant circuit consisting of a coil and a capacitor is set. When the undesired parts of the aluminum foil are removed by the etching procedure a coil in shape of a planar spiral and a first capacitor surface as well remain on the one side of the supporting foil and a second capacitor surface is produced by the etching procedure on the other side of the supporting foil which still is to be electrically connected to the first one.

In order to produce these known resonance labels predominantly aluminum foil is used for cost reasons and after this producing it is necessary to dispose of the etching slurry which remains after the etching process which must be done in consideration of pollution control which at the present is given special attention. Non-polluting disposal leads to not negletable higher costs.

SUMMARY OF THE INVENTION

Accordingly, it is a general object of the present invention to provide a method for a considerable reduction of poisonous etching sludge wherewith efforts regarding an improved pollution control are supported and costs for disposal are reduced.

A further object is to provide a method in which following the production of a spiral and of the first capacitor surface from an aluminium foil, applied on a supporting foil forming possibly the dielectric, by means of an etching method, an aluminium foil strip having possibly a dielectric placed thereupon facing the supporting foil, is sealed onto the other side of the supporting foil in a position superimposed relative to the first capacitor surface in order to form the second capacitor surface, and an electrical connection between the conductors on the two sides of the dielectric is established.

Accordingly, only the one side is subjected to an etching whereby the necessary second capacitor surface is sealed onto the other surface such that correspondingly less etching sludge is provided.

BRIEF DESCRIPTION OF THE DRAWING

The invention will be better understood and objects other than those set forth above will become apparent when consideration is given to the following detailed description thereof. Such description makes reference to the single drawing figure illustrating a procedure of producing a plurality of resonant circuits, specifically resonance labels according to the method and which are produced in a coherent manner.

DESCRIPTION OF THE PREFERRED EMBODIMENTS

Contrary to the known production methods this production does not proceed from a sandwich structure consisting of an aluminum foil, a supporting foil and an aluminum foil. There rather is used as base material a coextruded aluminum foil on a plastic supporting foil; preferably with a 50 $\mu$ aluminum foil on a 20–30 $\mu$ polyethlene foil. This supporting foil can also function as dielectric. The aluminum foil is printed in a known manner by an etching medium resistant lacquer and after the drying process of the lacquer the not printed portion of the aluminum foil is etched away. Thus, a coil 2 having the shape of a spiral and a first capacitor surface 3 adjacent the innermost winding of the spiral as well are arrived at on the supporting foil 1. At the same time a small supplementary surface 4 located at the outer end of the spiral 2 is produced by the etching procedure which supplementary surface 4 serves as electrical connection to the second capacitor surface which is to be placed onto the other side.

Following aspects are decisive in the arrangement and design of the spiral 2 and the first capacitor surface 3 illustrated in the drawing.

When designing a resonant circuit there is the problem of reconciling costs and output. The costs for the etching procedure are calculated per unit of area for which reason the resonance label should be made as small as possible, where against regarding the output a larger coil when used in a safety system against theft will generate a stronger signal which depends upon the diameter of the coil. Thus, in order to obtain as large as possible free area inside of the coil efforts are made to design the capacitor as small as possible. The procedure followed until now was to arrange on the limited space of a resonance label on both sides of the supporting foil two surfaces which are superimposed relative to each other or also two oppositely oriented conductor line sections in a superimposed position at both sides of the supporting foil in order to form the capacitor, whereby, however, it was necessary to make one of these two surfaces or conductor line sections broader than the other one during the printing in order to make sure that the two surfaces or conductor line sections of the capacitor are registered opposite other. When following this technique, however, a part of the free area is lost regarding the penetration of the lines of the magnetic field which again leads to a weaker signal.

In order to also avoid these above stated difficulties an etching procedure is made in accordance with the inventive method on one side of the supporting foil only, such that apart from the advantage of the reduction of the amount of etching sludge which evolves also the further advantage is achieved that the waste of area resulting from a counter surface printing operation can be avoided. Due to the etching procedure a small first capacitor surface 3 located adjacent the innermost winding of the spiral at the resonance label is produced in accordance with the present invention, due to which capacitor surface 3 the free area inside of the spiral 2 is reduced a little.

According to the illustration of the drawing a plurality of spirals 2 with one respective capacitor surface 3 and a supplementary surface 4 are produced side by side on a larger web of the supporting foil 1 e.g. by means of an etching method. According to the invention the following next step is to seal onto the other side of the supporting foil 1 an aluminum foil strip 5 illustrated with broken lines in such a manner that it is at a location superimposed relative to the first capacitor surface 3 and a few conductor windings of the spiral 2 and also at least partly superimposed relative to the supplementary surface 4. This aluminum foil strip 5 represents the second capacitor surface to which an electrical connection from the supplementary surface 4 is established for instance by a crimping at 6. It is then merely necessary to sever the continuous strip 5 by punching cuts 7 before the supporting foil 1 is severed by lateral and longitudinal cuts in order to obtain the individual resonant circuits for a following treating for instance for use as resonance labels.

The drawing illustrates only a cut-out from a large strip which at the end can form a roll. A roll can contain a plurality of strips located side by side and having spirals arranged sequentially or can consist of one strip only or a broader roll that can be separated into various strips.

During the sealing of the aluminum foil strip 5 onto the supporting foil it is possible if necessary to also conduct a surface treatment of this supporting foil such as for instance a corona treatment. The supporting foil which at the same time forms also the dielectric can be made e.g. of polypropylene, polystyrene or polyethylene and also LDPE and HDPE foils. Foils of these materials have good dielectric values in the desired frequency range and can be sealed.

The sealing of the strip 5 is made with help of heated rollers or punches whereby the pressure and/or the temperature is controlled and also whereby the thickness of the material of the foil is continuously controlled because the capacity of a capacitor depends upon the thickness of the dielectric present between the capacitor surfaces, whereby an increase of the thickness goes together with a decrease of the capacity.

The capacity of the capacitor influences in turn the frequency at which a resonance label is resonant. The frequency is governed by following relation $$f = \frac{1}{2\pi \sqrt{L \times C}},$$

where L stands for the inductance and C for the capacitance. The inductance depends upon the design of the coil and has a constant value after the etching operation such that now only the capacitance can be influenced by changing the thickness of the material of the supporting foil during the sealing of the aluminum foil strip 5 thereupon.

Accordingly, the frequency stability or precision is controlled in a preferred manner during the sealing procedure. Hereto use is made for instance of a presently widely used PC-controlled measuring procedure which compares actual values with design values.

The finally produced resonant circuits can be treated in various ways and form, when coated by paper and an adhesive, so-called resonance labels which for instance carry the price of the article or other information. The resonant circuits can also be placed into shells of a hard plastic which are mounted to the article or the ware to serve in a theft protection system the same purpose namely to trigger an alarm when passing a magnetic field at the exit of a store if the capacitor has not previously been switched off at the cash register when paying for the article, which alarm results from conducting connection between the two capacitor surfaces.

While there are shown and described present preferred embodiments of the invention, it is to be distinctly understood that the invention is not limited thereto, but may be otherwise variously embodied and practiced within the scope of the following claims.

I claim:

1. The method of producing electrically resonant labels for use in a theft protection system in which a spiral coil and a first capacitor surface are located on one surface of a dielectric substrate with a second capacitor surface located on the other substrate surface in registration with at least part of the first capacitor surface to form a resonant L-C circuit of precise resonant frequency within close enough tolerances that tuning is not required, comprising the steps of:

placing a thin aluminum layer on one surface of a thin supporting dielectric film, etching a pattern forming said spiral coil and first capacitor surface in said aluminum layer, and locating a precisely dimensioned performed aluminum strip layer on the other substrate surface in precise registration with the first capacitor surface to form the second capacitor surface, whereby the resonance frequency is kept within a very small frequency band without etching the second capacitor surface.

2. The method of claim 1 further comprising the steps of using a supporting film dielectric substrate of 20-30 microns thickness for the dielectric film, whereby the capacitance is high with the close positioning of the capacitor surfaces thereby to generate a stronger signals because of smaller capacity surfaces in an area detracting from the coil inductance.

3. The method of claim 2 further comprising the step of providing a supporting film dielectric substrate from the class containing a polyethylene, polypropylene, polystyrene, LDPE and HDPE foils.

4. The method of claim 1 further comprising the steps of extending the spiral coil and the second capacitor surfaces to form superimposed conductor positions on the two surfaces of the substrate bordering an outermost winding of the spiral coil to form electrical connection terminals.

5. The method of claim 1 wherein the locating step further comprises the steps of sealing the second capacitor surface to the dielectric substrate under heat and pressure controlled to establish a constant dielectric thickness of predetermined magnitude.

6. The method of claim 1 wherein a plurality of side by side spiral coils are located upon said dielectric substrate, the aluminum foil strip is superimposed in registration with a set of the spiral coils near a border of the spiral windings, and the strip is severed to form individual ones of the second capacitors.

* * * * *